United States Patent
Shibata et al.

(10) Patent No.: US 11,597,896 B2
(45) Date of Patent: Mar. 7, 2023

(54) CLEANING LIQUID, CLEANING METHOD, AND METHOD FOR PRODUCING SEMICONDUCTOR WAFER

(71) Applicant: Mitsubishi Chemical Corporation, Tokyo (JP)

(72) Inventors: Toshiaki Shibata, Tokyo (JP); Yasuhiro Kawase, Tokyo (JP); Ken Harada, Tokyo (JP); Atsushi Ito, Tokyo (JP); Tomohiro Kusano, Tokyo (JP); Yutaro Takeshita, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 247 days.

(21) Appl. No.: 17/178,827

(22) Filed: Feb. 18, 2021

(65) Prior Publication Data

US 2021/0171878 A1    Jun. 10, 2021

Related U.S. Application Data

(63) Continuation of application No. PCT/JP2019/033484, filed on Aug. 27, 2019.

(30) Foreign Application Priority Data

Aug. 30, 2018   (JP) .............. JP2018-161077

(51) Int. Cl.
*C11D 11/00* (2006.01)
*C11D 7/32* (2006.01)
*C11D 7/26* (2006.01)
*H01L 21/02* (2006.01)

(52) U.S. Cl.
CPC ............ *C11D 7/3281* (2013.01); *C11D 7/265* (2013.01); *C11D 7/3209* (2013.01); *C11D 11/0047* (2013.01); *H01L 21/02074* (2013.01)

(58) Field of Classification Search
CPC ................................. C11D 11/0047
USPC ....................................... 510/175
See application file for complete search history.

(56) References Cited

U.S. PATENT DOCUMENTS

| | | | |
|---|---|---|---|
| 6,194,366 B1 | 2/2001 | Naghshineh et al. | |
| 6,492,308 B1 | 12/2002 | Naghshineh et al. | |
| 2001/0004633 A1 | 6/2001 | Naghshineh et al. | |
| 2010/0081606 A1* | 4/2010 | Barger | C11D 3/2072 510/397 |
| 2012/0048295 A1 | 3/2012 | Du et al. | |
| 2014/0371124 A1* | 12/2014 | Harada | B08B 3/04 510/175 |

FOREIGN PATENT DOCUMENTS

| | | |
|---|---|---|
| JP | 2003-536258 A | 12/2003 |
| JP | 2004-518819 A | 6/2004 |
| JP | 2015-165561 A | 9/2015 |
| JP | 2015-165562 A | 9/2015 |
| JP | 2015-203047 A | 11/2015 |
| JP | 2016-178118 A | 10/2016 |
| WO | WO 2010/104816 A1 | 9/2010 |

OTHER PUBLICATIONS

International Search Report dated Nov. 19, 2019 in PCT/JP2019/033484 filed Aug. 27, 2019, citing documents AD and AS-AU therein, 1 page.

* cited by examiner

*Primary Examiner* — Gregory E Webb

(74) *Attorney, Agent, or Firm* — Oblon, McClelland, Maier & Neustadt, L.L.P.

(57) ABSTRACT

The present invention relates to a cleaning liquid containing a component (A): a compound represented by the following formula (1), component (B): alkylamine, component (C): polycarboxylic acid, and component (D): ascorbic acid, in which a mass ratio of the component (A) to a total mass of the component (B) and the component (C) is 1 to 15, and in the formula (1), $R^1$, $R^2$, and $R^3$ each have a definition same as the definition described in the description,

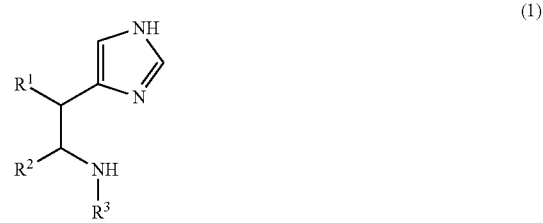

(1)

13 Claims, No Drawings

CLEANING LIQUID, CLEANING METHOD, AND METHOD FOR PRODUCING SEMICONDUCTOR WAFER

TECHNICAL FIELD

The present invention relates to a cleaning liquid. In addition, the present invention relates to a cleaning method. Further, the present invention relates to a method for producing a semiconductor wafer.

BACKGROUND ART

A semiconductor wafer is produced by deposition of a metal film working as a wiring and an interlayer dielectric on a silicon substrate, subsequently conducting a surface planarization by means of a chemical mechanical polishing (hereinafter referred to as "CMP") step using an abrasive composed of an aqueous slurry containing abrasive fine particles, and then stacking new layers on the planarized surface. In microfabrication of the semiconductor wafer, each layer is required to have planarity with high precision, and importance of the planarization treatment by means of CMP is very high.

In recent production step of a semiconductor device, a copper wiring made of a copper film having a low resistance value has been introduced in order to increase the operating speed and density of device integration.

Copper is suitable for microfabrication because of having good workability. On the other hand, oxidation and corrosion of copper wiring in the CMP step has been a problem, since copper is easily corroded by acid components or alkaline components.

On the surface of the semiconductor wafer after the CMP step, many fine particles such as colloidal silica used in the CMP step and organic residues derived from corrosion inhibitor contained in the slurry are present. Therefore, in order to remove the fine particles and the organic residues, the semiconductor wafer after the CMP step is subjected to a cleaning step.

As the cleaning step in the production process of a semiconductor device, in which the step is represented by the cleaning step after the CMP step, a cleaning step using a cleaning liquid is often adopted. For example, Patent Literatures 1 to 6 disclose a cleaning liquid which is used in a cleaning step during a production process of a semiconductor device.

CITATION LIST

Patent Literature

Patent Literature 1: JP-A-2016-178118
Patent Literature 2: JP-A-2015-165561
Patent Literature 3: JP-T-2003-536258
Patent Literature 4: JP-T-2004-518819
Patent Literature 5: JP-A-2015-203047
Patent Literature 6: JP-A-2015-165562

SUMMARY OF INVENTION

Technical Problem

When the cleaning liquid after the CMP step is an acidic aqueous solution, there is a problem that it is difficult to remove the colloidal silica, since colloidal silica is positively charged, the surface of the semiconductor wafer is negatively charged, and an electrical attractive force acts in the aqueous solution. In contrast, when the cleaning liquid after the CMP step is an alkaline aqueous solution, both the colloidal silica and the surface of the semiconductor wafer are negatively charged, an electrical repulsive force acts, and it becomes easy to remove the colloidal silica, since hydroxide ions are abundantly present in the aqueous solution.

In addition, copper dissolves as copper ions ($Cu^{2+}$) in the acidic aqueous solution. On the other hand, copper forms a passive film of copper oxides ($Cu_2O$ or $CuO$) on the surface of the semiconductor wafer in the alkaline aqueous solution. According to this mechanism, when copper is exposed on the surface of the semiconductor wafer after the CMP step, it is considered that the corrosion of copper in the semiconductor wafer in the cleaning step after the CMP step is more reduced when using a cleaning liquid of an alkaline aqueous solution as compared to when using a cleaning liquid of an acidic aqueous solution.

The cleaning liquid disclosed in Patent Literature 1 and Patent Literature 2 is poor in inhibitory effect of corrosion to copper or a compound containing copper because of not containing an ascorbic acid.

In addition, the cleaning liquid disclosed in Patent Literature 3 and Patent Literature 4 is poor in removability of organic residue because of not containing a histidine.

Further, the cleaning liquid disclosed in Patent Literature 5 and Patent Literature 6 is insufficient in selecting the type of compounding component and setting the compounding ratio of histidine to other components, and are thus poor in inhibitory effect of corrosion to copper or a compound containing copper and in removability of organic residue.

The present invention has been made in view of such problems, and an object of the present invention is to provide a cleaning liquid having excellent removability of organic residue while preventing corrosion of copper or a compound containing copper. Another object of the present invention is to provide a cleaning method having excellent removability of organic residue while preventing corrosion of copper or compound containing copper.

Solution to Problem

Previously, cleaning liquids containing various components have been studied. As a result of intensive studies, the present inventors have found a cleaning liquid that combines the following component (A) to component (D), and have further found that there is a suitable range for a mass ratio of the component (A) to a total mass of the component (B) and the component (C), and this cleaning liquid is excellent in inhibitory effect of corrosion to copper or a compound containing copper and in removability of organic residue.

Namely, the gist of the present invention is in the following <1> to <13>.

<1> A cleaning liquid comprising the following component (A) to component (D), wherein a mass ratio of the component (A) to a total mass of the component (B) and the component (C) is 1 to 15:

component (A): a compound represented by the following formula (1);

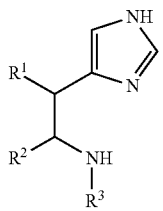

(in the formula (1), $R^1$ represents a hydrogen atom or an alkyl group having 1 to 4 carbon atoms, $R^2$ represents a carboxyl group, a carbonyl group, a functional group having an ester bond, a hydrogen atom or an alkyl group having 1 to 4 carbon atoms, and $R^3$ represents an acetyl group, a hydrogen atom or an alkyl group having 1 to 4 carbon atoms;)
component (B): an alkylamine;
component (C): a polycarboxylic acid; and
component (D): an ascorbic acid.
<2> The cleaning liquid according to <1>, wherein a mass ratio of the component (C) to a mass of the component (B) is 1 to 15.
<3> The cleaning liquid according to <1> or <2>, wherein the component (A) contains at least one selected from the group consisting of histidine and derivatives of histidine.
<4> The cleaning liquid according to any one of <1> to <3>, wherein the component (B) contains alkyldiamine.
<5> The cleaning liquid according to <4>, wherein alkyldiamine contains at least one selected from the group consisting of 1,2-diaminopropane, 1,3-diaminopropane, and N-methyl-1,3-diaminopropane.
<6> The cleaning liquid according to any one of <1> to <5>, wherein the component (C) contains at least one selected from the group consisting of citric acid and derivatives of citric acid.
<7> The cleaning liquid according to any one of <1> to <6>, further comprising the following component (E), component (E): a quaternary ammonium hydroxide.
<8> The cleaning liquid according to any one of <1> to <7>, further comprising the following component (F), component (F): water.
<9> The cleaning liquid according to any one of <1> to <8>, wherein a pH is 10.0 to 14.0.
<10> The cleaning liquid according to any one of <1> to <9>, which is used for cleaning after chemical mechanical polishing or cleaning after etching.
<11> The cleaning liquid according to any one of <1> to <10>, which is used for cleaning a surface where copper or a compound containing cobalt is exposed.
<12> A cleaning method for cleaning a semiconductor wafer using the cleaning liquid according to any one of <1> to <11>.
<13> A method for producing a semiconductor wafer, comprising: cleaning a semiconductor wafer using the cleaning liquid according to any one of <1> to <11>.

Advantageous Effects of Invention

The cleaning liquid according to the present invention is excellent in removability of organic residue while preventing corrosion of copper or a compound containing copper.

In addition, the cleaning method according to the present invention is excellent in removability of organic residue while preventing corrosion of copper or a compound containing copper Further, the method for producing a semiconductor wafer according to the present invention includes a cleaning step excellent in removability of organic residue while preventing corrosion of copper or a compound containing copper, so that it is possible to prevent malfunction of the semiconductor device.

DESCRIPTION OF EMBODIMENTS

Hereinafter, embodiments of the present invention are specifically described, but it should not be construed that the present invention is limited to the following embodiments, and the present invention can be carried out by making various changes within the scope of a gist thereof. In the present description, the expression "to" is used as an expression including numerical values or physical property values before and after the expression.

[Cleaning Liquid]

A cleaning liquid according to the present invention contains the following component (A) to component (D):
component (A): a compound represented by the following formula (1)
component (B): alkylamine
component (C): polycarboxylic acid
component (D): ascorbic acid.
(Component (A))
The component (A) is a compound represented by the following formula (1).

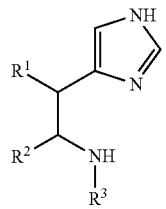

In the formula (1), $R^1$ represents a hydrogen atom or an alkyl group having 1 to 4 carbon atoms, $R^2$ represents a carboxyl group, a carbonyl group, a functional group having an ester bond, a hydrogen atom or an alkyl group having 1 to 4 carbon atoms, and $R^3$ represents an acetyl group, a hydrogen atom or an alkyl group having 1 to 4 carbon atoms.

When the cleaning liquid according to the present invention contains the component (A), an amino group and an imidazole group in the structure of the component (A) make coordinate covalent bonds with a metal ion to capture the metal ion in an insoluble metal complex such as a copper-benzotriazole complex and help to solve it in the cleaning liquid. Therefore, the cleaning liquid according to the present invention is excellent in removability of organic residue.

In the formula (1), $R^1$ represents a hydrogen atom or an alkyl group having 1 to 4 carbon atoms.

In the present invention, examples of the alkyl group having 1 to 4 carbon atoms include a methyl group, an ethyl group, an n-propyl group, an isopropyl group, an n-butyl group, an isobutyl group, a sec-butyl group, and a tert-butyl group.

$R^1$ is preferably a hydrogen atom and a methyl group, and more preferably a hydrogen atom from the viewpoint of obtaining excellent removability of organic residue.

In the formula (1), $R^2$ represents a carboxyl group, a carbonyl group, a functional group having an ester bond, a hydrogen atom or an alkyl group having 1 to 4 carbon atoms.

Examples of the functional group having an ester bond include a methyl ester group, and an ethyl ester group.

$R^2$ is preferably a carboxyl group or an alkyl group having 1 to 4 carbon atoms, and more preferably a carboxyl group from the viewpoint of obtaining excellent removability of organic residue.

In the formula (1), $R^3$ represents an acetyl group, a hydrogen atom or an alkyl group having 1 to 4 carbon atoms. $R^3$ is preferably a hydrogen atom and an alkyl group having 1 to 4 carbon atoms, and more preferably a hydrogen atom from the viewpoint of obtaining excellent removability of organic residue.

Specific examples of the component (A) include histidines such as L-histidine and D-histidine, and histidine derivatives such as N-acetyl-L-histidine. These components (A) may be used alone or in combination of two or more thereof. Among these components (A), histidines are preferred, and L-histidine is more preferred from the viewpoint of obtaining excellent removability of organic residue.

(Component (B))

The component (B) is alkylamine.

The alkylamine refers to a compound having at least an alkyl group and an amino group in the molecule. The number of carbon atoms of the alkyl group is preferably 1 to 6, more preferably 2 to 4, and still more preferably 3 from the viewpoint of obtaining excellent removability of organic residue.

When the cleaning liquid according to the present invention contains the component (B), an amino group in the structure of the component (B) makes covalent coordinate bonds with a metal ion to capture the metal ion in an insoluble metal complex such as a copper-benzotriazole complex and help to solve it in the cleaning liquid. Therefore, the cleaning liquid according to the present invention is excellent in removability of organic residue.

Specific examples of the component (B) include alkyl monoamines such as aminomethane and aminoethane, and alkyldiamines such as 1,2-diaminoethane, 1,2-diaminopropane, 1,3-diaminopropane, 2-methyl-1,3-diaminopropane, N-methyl-1,3-diaminopropane, and 1,4-diaminobutane. These components (B) may be used alone or in combination of two or more thereof. Among these components (B), alkyldiamines are preferred, 1,2-diaminopropane, 1,3-diaminopropane, and N-methyl-1,3-diaminopropane are more preferred, and 1,2-diaminopropane is still more preferred from the viewpoint of obtaining excellent removability of organic residue.

(Component (C))

The component (C) is polycarboxylic acid.

The polycarboxylic acid refers to a compound having at least two or more carboxyl groups in the molecule.

When the cleaning liquid according to the present invention contains the component (C), a carboxyl group in the structure of the component (C) makes covalent coordinate bonds with a metal ion to capture the metal ion in an insoluble metal complex such as a copper-benzotriazole complex and help to solve it in the cleaning liquid. Therefore, the cleaning liquid according to the present invention is excellent in removability of organic residue.

The number of the carboxyl group in the molecule of the component (C) is preferably 2 to 10, more preferably 2 to 6, still more preferably 3 to 4, and particularly preferably 3 from the viewpoint of obtaining excellent removability of organic residue.

It is preferable that the component (C) further has a hydroxy group in the molecule from the viewpoint of obtaining excellent removability of organic residue. The number of the hydroxy group in the molecule of the component (C) is preferably 1 to 8, more preferably 1 to 4, still more preferably 1 to 2, and particularly preferably 1 from the viewpoint of obtaining excellent removability of organic residue.

Specific examples of the component (C) include oxalic acid, citric acid, tartaric acid, malic acid, succinic acid, glutaric acid, adipic acid, malonic acid, and derivatives thereof. These components (C) may be used alone or in combination of two or more thereof. Among these components (C), oxalic acid, citric acid, tartaric acid, malic acid, and derivatives thereof are preferred, citric acid, malic acid, and derivatives thereof are more preferred, and citric acid and a citric acid derivative are still more preferred from the viewpoint of obtaining excellent removability of organic residue.

(Component (D))

The component (D) is an ascorbic acid.

When the cleaning liquid according to the present invention contains the component (D), the redox potential in the cleaning liquid can be reduced and the oxidation of metals such as copper can be prevented.

Specific examples of the component (D) include L-ascorbic acid, D-ascorbic acid, and isoascorbic acid. These components (D) may be used alone or in combination of two or more thereof. Among these components (D), L-ascorbic acid and D-ascorbic acid are preferred, and L-ascorbic acid is more preferred from the viewpoint of obtaining an inhibitory effect of corrosion on copper or a compound containing copper.

(Component (E))

The cleaning liquid according to the present invention preferably contains the following component (E) in addition to the above component (A) to component (D) since the pH can be adjusted without the cleaning liquid remaining on the semiconductor wafer after cleaning.

Component (E): a Quaternary Ammonium Hydroxide

Specific examples of the component (E) include tetramethylammonium hydroxide, tetraethylammonium hydroxide, tetrabutylammonium hydroxide, triethylmethylammonium hydroxide, didecyl(dimethyl)ammonium hydroxide, diethyl(methyl)propylammonium hydroxide, hydroxyethyltrimethylammonium hydroxide, and methyltriethanolammonium hydroxide. These components (E) may be used alone or in combination of two or more thereof. Among these components (E), tetramethylammonium hydroxide, tetraethylammonium hydroxide, and tetrabutylammonium hydroxide are preferred, tetramethylammonium hydroxide and tetraethylammonium hydroxide are more preferred, and tetraethylammonium hydroxide is still more preferred from the viewpoint of obtaining storage stability.

(Component (F))

The cleaning liquid according to the present invention preferably contains the following component (F) in addition to the above component (A) to component (D) from the viewpoint of obtaining fine particle removability.

Component (F): Water (Other Components)

The cleaning liquid according to the present invention may contain components other than the above component (A) to component (F) as long as the effects of the present invention are not impaired.

Examples of other components include a surfactant and an etching inhibitor.

The component (A) to component (E) and other components may be in the form of salts.

Examples of the salt include a sodium salt, a potassium salt, a calcium salt, and a magnesium salt.

(Physical Properties of Cleaning Liquid)

The pH of the cleaning liquid is preferably 10.0 to 14.0, more preferably 10.5 to 13.0, and still more preferably 11.0 to 12.0. When the pH is 10.0 or more, copper or a compound containing copper is prevented from being corroded, and the removability of organic residue is excellent. When the pH is 14.0 or less, the degree of freedom in selecting the type of compounding components and setting the mixing ratio is high in the cleaning liquid, the content of the component (E) in the cleaning liquid can be lowered, and the raw material cost of the cleaning liquid can be reduced.

(Redox Potential of Cleaning Liquid)

The redox potential of the cleaning liquid is preferably −600 mV to 0 mV, and more preferably −350 mV to −50 mV since the copper surface after cleaning can be covered with thick copper oxide ($Cu_2O$) and the stability of the copper surface after cleaning is excellent.

(Mass Ratio of Components)

The cleaning liquid according to the present invention is remarkably excellent in effects of the present invention by setting mass ratios of the component (A), (B) and (C) having a chelating effect within specific ranges. Specifically, the mass ratio of the component (A) to the total mass of the component (B) and the component (C) is 1 to 15.

The mass ratio of the component (A) to the total mass of the component (B) and the component (C) (mass of component (A)/total mass of component (B) and component (C)) is 1 to 15, preferably 1.1 to 5, and more preferably 1.2 to 2.2. When the mass ratio of the component (A) to the total mass of the component (B) and the component (C) is 1 or more, the removability of organic residue is excellent. When the mass ratio of the component (A) to the total mass of the component (B) and the component (C) is 15 or less, the inhibitory effect of corrosion on copper or a compound containing copper is excellent.

The mass ratio of the component (A) to the component (B) (mass of component (A)/mass of component (B)) is preferably 3 to 60, and more preferably 4 to 30. When the mass ratio of the component (A) to the component (B) is 3 or more, the removability of organic residue is excellent. When the mass ratio of the component (A) to the component (B) is 60 or less, the inhibitory effect of corrosion on copper or a compound containing copper is excellent.

The mass ratio of the component (A) to the component (C) (mass of component (A)/mass of component (C)) is preferably 1.5 to 20, and more preferably 2 to 6. When the mass ratio of the component (A) to the component (C) is 1.5 or more, the removability of organic residue is excellent. When the mass ratio of the component (A) to the component (C) is 20 or less, the inhibitory effect of corrosion on copper or a compound containing copper is excellent.

The mass ratio of the component (A) to the component (D) (mass of component (A)/mass of component (D)) is preferably 0.1 to 10, and more preferably 0.2 to 5. When the mass ratio of the component (A) to the component (D) is 0.1 or more, the removability of organic residue is excellent. When the mass ratio of the component (A) to the component (D) is 10 or less, the inhibitory effect of corrosion on copper or a compound containing copper is excellent.

The mass ratio of the component (C) to the component (B) (mass of component (C)/mass of component (B)) is preferably 1 to 15, and more preferably 2 to 12. When the mass ratio of the component (C) to the component (B) is 1 or more, the removability of organic residue is excellent. When the mass ratio of the component (C) to the component (B) is 15 or less, the inhibitory effect of corrosion on copper or a compound containing copper is excellent.

The mass ratio of the component (B) to the component (D) (mass of component (B)/mass of component (D)) is preferably 0.02 to 0.4, and more preferably 0.04 to 0.3. When the mass ratio of the component (B) to the component (D) is 0.02 or more, the removability of organic residue is excellent. When the mass ratio of the component (B) to the component (D) is 0.4 or less, the inhibitory effect of corrosion on copper or a compound containing copper is excellent.

The mass ratio of the component (C) to the component (D) (mass of component (C)/mass of component (D)) is preferably 0.05 to 0.7, and more preferably 0.02 to 0.5. When the mass ratio of the component (C) to the component (D) is 0.05 or more, the removability of organic residue is excellent. When the mass ratio of the component (C) to the component (D) is 0.7 or less, the inhibitory effect of corrosion on copper or a compound containing copper is excellent.

When the cleaning liquid contains the component (E), the mass ratio of the component (A) to the component (E) (mass of component (A)/mass of component (E)) is preferably 0.02 to 2, and more preferably 0.05 to 1. When the mass ratio of the component (A) to the component (E) is 0.02 or more, the removability of organic residue is excellent. When the mass ratio of the component (A) to the component (E) is 2 or less, the pH of the cleaning liquid can be easily adjusted.

When the cleaning liquid contains the component (E), the mass ratio of the component (B) to the component (E) (mass of component (B)/mass of component (E)) is preferably 0.001 to 0.1, and more preferably 0.002 to 0.05. When the mass ratio of the component (B) to the component (E) is 0.001 or more, the removability of organic residue is excellent. When the mass ratio of the component (B) to the component (E) is 0.1 or less, the pH of the cleaning liquid can be easily adjusted.

When the cleaning liquid contains the component (E), the mass ratio of the component (C) to the component (E) (mass of component (C)/mass of component (E)) is preferably 0.005 to 0.5, and more preferably 0.01 to 0.2. When the mass ratio of the component (C) to the component (E) is 0.005 or more, the removability of organic residue is excellent. When the mass ratio of the component (C) to the component (E) is 0.5 or less, the pH of the cleaning liquid can be easily adjusted.

When the cleaning liquid contains the component (E), the mass ratio of the component (D) to the component (E) (mass of component (D)/mass of component (E)) is preferably 0.02 to 2, and more preferably 0.05 to 1. When the mass ratio of the component (D) to the component (E) is 0.02 or more, the inhibitory effect of corrosion on copper or a compound containing copper is excellent. When the mass ratio of the component (D) to the component (E) is 2 or less, the pH of the cleaning liquid can be easily adjusted.

(Contents in Cleaning Liquid)

The content of the component (A) is preferably 0.001 mass % to 10 mass %, more preferably 0.005 mass % to 1 mass %, and still more preferably 0.01 mass % to 0.1 mass % in 100 mass % of the cleaning liquid. When the content of the component (A) is 0.001 mass % or more, the removability of organic residue is excellent. When the content of the component (A) is 10 mass % or less, the inhibitory effect of corrosion on copper or a compound containing copper is excellent.

The content of the component (B) is preferably 0.0001 mass % to 1 mass %, more preferably 0.0003 mass % to 0.1 mass %, and still more preferably 0.0005 mass % to 0.02 mass % in 100 mass % of the cleaning liquid. When the content of the component (B) is 0.0001 mass % or more, the removability of organic residue is excellent. When the content of the component (B) is 1 mass % or less, the inhibitory effect of corrosion on copper or a compound containing copper is excellent.

The content of the component (C) is preferably 0.0005 mass % to 5 mass %, more preferably 0.002 mass % to 0.5 mass %, and still more preferably 0.005 mass % to 0.05 mass % in 100 mass % of the cleaning liquid. When the content of the component (C) is 0.0005 mass % or more, the removability of organic residue is excellent. When the content of the component (C) is 5 mass % or less, the inhibitory effect of corrosion on copper or a compound containing copper is excellent.

The content of the component (D) is preferably 0.001 mass % to 10 mass %, more preferably 0.005 mass % to 1 mass %, and still more preferably 0.01 mass % to 0.1 mass % in 100 mass % of the cleaning liquid. When the content of the component (D) is 0.001 mass % or more, the inhibitory effect of corrosion on copper or a compound containing copper is excellent. When the content of the component (D) is 10 mass % or less, the pH of the cleaning liquid can be easily adjusted.

When the cleaning liquid contains the component (E), the content of the component (E) is preferably 0.01 mass % to 30 mass %, more preferably 0.03 mass % to 5 mass %, and still more preferably 0.05 mass % to 0.5 mass % in 100 mass % of the cleaning liquid. When the content of the component (E) is 0.01 mass % or more, the pH of the cleaning liquid can be easily adjusted. When the content of the component (E) is 30 mass % or less, the pH of the cleaning liquid can be adjusted without impairing the effects of the present invention.

When the cleaning liquid contains components other than the component (A) to component (F), the content of other components is preferably 1 mass % or less, more preferably 0 mass % to 0.1 mass %, and still more preferably 0 mass % to 0.01 mass % in 100 mass % of the cleaning liquid. When the content of the other components is 1 mass % or less, the effects of the other components can be imparted without impairing the effects of the present invention.

When the cleaning liquid contains the component (F), the content of the component (F) is preferably the balance of the components other than the component (F) (the component (A) to component (E) and the other components).

(Method for Producing Cleaning Liquid)

The method for producing the cleaning liquid according to the present invention is not particularly limited, and the cleaning liquid can be produced by mixing the component (A) to component (D) and, if necessary, the component (E), the component (F), and the other components.

The order of mixing is not particularly limited, and all the components may be mixed at one time, or some components may be mixed in advance and then the remaining components may be mixed.

In the method for producing the cleaning liquid according to the present invention, each component may be blended to have a content suitable for cleaning, or a cleaning liquid containing each component other than the component (F) may be prepared at a high content, and then the cleaning liquid may be prepared by diluting with the component (F) before cleaning since transportation and storage costs can be reduced.

The dilution ratio can be appropriately set according to an object to be cleaned, and is preferably 30 to 100 times, and more preferably 40 to 90 times.

(Object to be Cleaned)

Examples of the object to be cleaned of the cleaning liquid according to the present invention include semiconductor wafers such as semiconductors, glass, metals, ceramics, resins, magnetic materials, and superconductors. Among these objects to be cleaned, a semiconductor wafer having a surface where a metal is exposed is preferred since organic residues and fine particles can be removed by cleaning in a short time.

Examples of the metal include tungsten, copper, titanium, chromium, cobalt, zirconium, hafnium, molybdenum, ruthenium, gold, platinum, silver, and compounds containing the above metals (nitrides of the above metals, oxides of the above metal, of silicides of the above metals). Among these metals, tungsten, copper, cobalt, ruthenium, and compounds containing the above metals are preferred because of having a low resistivity and being suitable for semiconductors, and copper and a compound containing copper are more preferred in the viewpoint of obtaining an excellent inhibitory effect of corrosion.

The cleaning liquid according to the present invention can also be suitably used for a semiconductor wafer having a surface where a low dielectric constant insulating material is exposed, because of having excellent removability of organic residue even for the low dielectric constant insulating material with high hydrophobicity.

Examples of the low dielectric constant insulating material include: organic polymer materials such as Polyimide, BCB (Benzocyclobutene), Flare (trade name, manufactured by Honeywell), SiLK (trade name, manufactured by Dow Chemical Company); inorganic polymer materials such as FSG (Fluorinated silicate glass); and SiOC-based materials such as BLACK DIAMOND (trade name, manufactured by Applied Materials), and Aurora (trade name, manufactured by ASM Japan).

(Types of Cleaning Step)

Because of being excellent in removability of organic residue and inhibitory effect of corrosion on metals, the cleaning liquid according to the present invention can be suitably used for cleaning after chemical mechanical polishing and cleaning after etching, and can be particularly preferably used for cleaning after chemical mechanical polishing.

The chemical mechanical polishing (CMP) step refers to a step of mechanically processing and planarizing the surface of a semiconductor wafer. In general, in the CMP step, using a dedicated device, a back side of the semiconductor wafer is attached to a head, and the surface of the semiconductor wafer is pressed against a polishing pad, and an abrasive containing abrasive particles is dropped onto the polishing pad to polish the surface of the semiconductor wafer.

The etching step refers to a step of removing a target thin film in a pattern using a resist formed in a lithography process as a mask and forming a desired shape on the semiconductor wafer. Examples of the shape formed in the etching step include a wiring pattern, a via hole for electrically connecting wirings, and a trench (groove) for separating elements. In general, the etching step is performed by a method called reactive ion etching using a reactive gas such as fluorocarbon.

(CMP)

In the CMP, polishing is performed by rubbing an object to be polished against the polishing pad using an abrasive.

Examples of the abrasive include abrasive fine particles such as colloidal silica ($SiO_2$), fumed silica ($SiO_2$), alumina ($Al_2O_3$), and ceria ($CeO_2$). These abrasive fine particles are the main cause of fine particle contamination of the object to be polished. However, the cleaning liquid according to the present invention has a function of removing fine particles adhering to the object to be polished, dispersing the particles in the cleaning liquid, and preventing re-adhesion, and thus exhibits a high effect in eliminating fine particle contamination.

In addition to the abrasive fine particles, additives such as an anti-corrosive agent, an oxidizing agent, and a dispersing agent may be contained in the abrasive. In particular, in CMP for a semiconductor wafer having a surface where copper or a compound containing copper is exposed, an anti-corrosive agent is often contained since copper is easily corroded.

As the anti-corrosive agent, an azole-based anti-corrosive agent having a high anti-corrosive effect is preferably used. More specifically, examples of the anti-corrosive agent containing a heterocycle in which the hetero atom is only a nitrogen atom include a diazole-based anti-corrosive agent, a triazole-based anti-corrosive agent, and a tetrazole-based anti-corrosive agent; examples of the anti-corrosive agent containing a heterocycle including a nitrogen atom and an oxygen atom include an oxazole-based anti-corrosive agent, an isoxazole-based anti-corrosive agent, and an oxadiazole-based anti-corrosive agent; and examples of the anti-corrosive agent containing a heterocycle including a nitrogen atom and a sulfur atom include a thiazole-based anti-corrosive agent, an isothiazole-based anti-corrosive agent, and a thiadiazole-based anti-corrosive agent. Among these anti-corrosive agents, a triazole-based anti-corrosive agent is preferred because of having an excellent anti-corrosive effect. Among the triazole-based anti-corrosive agent, a benzotriazole-based anti-corrosive agent is more preferred.

When applied to a semiconductor wafer after being polished with an abrasive containing such an anti-corrosive agent, the cleaning liquid according to the present invention is excellent in eliminating contamination derived from the anti-corrosive agent very effectively. That is, when such an anti-corrosive agent is present in the abrasive, the corrosion of the surface of copper is prevented, otherwise copper ions eluted during polishing are reacted with the abrasive and many insoluble precipitates are generated. The cleaning liquid according to the present invention can efficiently dissolve and remove such insoluble precipitates and can improve the throughput.

(Cleaning Conditions)

For cleaning the object to be cleaned, a method of bringing the cleaning liquid according to the present invention into direct contact with the object to be cleaned is preferred.

Examples of the method of bringing the cleaning liquid according to the present invention into direct contact with the object to be cleaned include: a dipping method in which a cleaning tank is filled with the cleaning liquid according to the present invention to immerse the object to be cleaned; a spin method for rotating the object to be cleaned at a high speed while flowing from a nozzle the cleaning liquid according to the present invention onto the object to be cleaned; and a spray method for spraying the cleaning liquid according to the present invention onto the object to be cleaned for cleaning. Among these methods, the spin method and the spray method are preferred since more efficient contamination elimination can be performed in a short time.

Examples of an apparatus for performing such cleaning include a batch cleaning apparatus for simultaneously cleaning a plurality of objects to be cleaned, which are accommodated in a cassette, and a single wafer cleaning apparatus for mounting a single object to be cleaned on a holder and performing cleaning. Among these apparatuses, a single wafer cleaning apparatus is preferred since the cleaning time can be shortened and the use of the cleaning liquid according to the present invention can be reduced.

As the cleaning method for an object to be cleaned, cleaning by means of physical force is preferred since the removability of fine particles attached to the object to be cleaned is further improved and the cleaning time can be shortened, scrub cleaning using a cleaning brush and ultrasonic cleaning with a frequency of 0.5 megahertz or more are more preferred, and scrub cleaning using a resin brush is still more preferred because of being more suitable for cleaning after CMP.

The material of the resin brush is not particularly limited, and polyvinyl alcohol and polyvinyl formal are preferred since the resin brush itself can be easily produced.

The cleaning temperature may be room temperature, and may be heated to 30° C. to 70° C. as long as the performance of the semiconductor wafer is not impaired.

[Cleaning Method]

The cleaning method according to the present invention is a method including a step of cleaning a semiconductor wafer using the cleaning liquid according to the present invention, and specific cleaning conditions and the like are as described above.

[Method for Producing Semiconductor Wafer]

The method for producing a semiconductor wafer according to the present invention is a method including a step of cleaning a semiconductor wafer using the cleaning liquid according to the present invention, and specific cleaning conditions and the like are as described above.

EXAMPLES

Hereinafter, the present invention is demonstrated further more concretely by ways of Examples, but the present invention is not limited to following Examples, unless the gist of the present invention is exceeded.

Example 1

The following components were prepared as raw materials for the cleaning liquid.

Component (A-1): L-histidine (manufactured by Tokyo Chemical Industry Co., Ltd.)

Component (B-1): 1,2-diaminopropane (manufactured by Tokyo Chemical Industry Co., Ltd.)

Component (B-2): 1,3-diaminopropane (manufactured by Tokyo Chemical Industry Co., Ltd.)

Component (B-3): N-methyl-1,3-diaminopropane (manufactured by Tokyo Chemical Industry Co., Ltd.)

Component (B'-1): imidazole (manufactured by Tokyo Chemical Industry Co., Ltd.)

Component (C-1): citric acid (manufactured by Showa Kako Co., Ltd.)

Component (C-2): tartaric acid (manufactured by Showa Kako Co., Ltd.)

Component (C-3): succinic acid (manufactured by FUJI-FILM Wako Pure Chemical Corporation)

Component (D-1): L-ascorbic acid (manufactured by Tokyo Chemical Industry Co., Ltd.)

Component (D'-1): gallic acid (manufactured by Tokyo Chemical Industry Co., Ltd.)

Component (E-1): tetraethylammonium hydroxide (manufactured by Tokyo Chemical Industry Co., Ltd.)

Component (F-1): water

A cleaning liquid was obtained by mixing the components such that the content of the component (A-1) was 0.040 mass %, the content of the component (B-1) was 0.002 mass %, the content of the component (C-1) was 0.020 mass %, the content of the component (D-1) was 0.040 mass %, the content of the component (E-1) was 0.140 mass %, and the balance was the component (F-1) in 100 mass % of the cleaning liquid.

(Measurement of pH)

The pH of the cleaning liquid obtained in Example 1 was measured with a pH meter (model name "D-24", manufactured by Horiba, Ltd.) while the cleaning liquid was stirred with a magnetic stirrer in a constant temperature bath at 25° C. The results are shown in Table 1.

(Measurement of Inhibitory Effect of Corrosion)

A silicon substrate (manufactured by Advantech Co., Ltd.) obtained by depositing copper to a film thickness of 1.5 μm was cut into 20 mm×20 mm and immersed in 20 g of the cleaning liquid obtained in Example 1 at 25° C. for 10 minutes. After the immersion, the silicon substrate was taken out, and the copper concentration in the cleaning liquid was measured using an ICP emission spectroscopic analyzer (model name "SPS 1700HVR", manufactured by Seiko Instruments Inc.).

Based on the measured copper concentration, the copper etching rate (nm/min) was calculated using the following mathematical formula (A), and the inhibitory effect of corrosion was evaluated. The results are shown in Table 1. The smaller the value of the copper etching rate (nm/min), the higher the inhibitory effect of corrosion.

$$\text{Copper etching rate} = (\text{copper concentration in cleaning liquid} \times \text{volume of cleaning liquid})/(\text{copper density} \times \text{surface area of silicon substrate} \times \text{immersion time}) \quad (A)$$

(Measurement of Removability of Organic Residue)

CMP was performed on a silicon substrate (manufactured by Advantech Co., Ltd.) obtained by vapor-depositing copper to a film thickness of 1.5 μm, using an abrasive containing silica and benzotriazole and a CMP device (model name "LGP-15RD", manufactured by Lapmaster SFT Co., Ltd.), and then the surface of the silicon substrate was cleaned using a polyvinyl alcohol brush while supplying the cleaning liquid obtained in Example 1 onto the surface of the silicon substrate.

With respect to the obtained silicon substrate after CMP cleaning, the number of defects of 0.35 μm or more on the silicon substrate was measured using a wafer surface inspection device (model name "LS-6600", manufactured by Hitachi High-Tech Fielding Corporation) to evaluate the removability of organic residue. The results are shown in Table 1.

Examples 2 to 11 and Comparative Examples 1 to 7

Cleaning liquids were obtained by operations same as in Example 1 except that the types and contents of the raw materials were shown in Table 1, and measurements same as in Example 1 were performed. The results are shown in Table 1.

TABLE 1

| | | Component (A) | | Component (B) | | Component (C) | | Component (D) | | Component (E) | | (A)/{(B)+(C)} | pH | Inhibitory effect of corrosion (nm/min) | Removability of organic residue (number) |
|---|---|---|---|---|---|---|---|---|---|---|---|---|---|---|---|
| | | Type | Content (mass %) | Type | Content (mass %) | Type | Content (mass %) | Type | Content (mass %) | Type | Content (mass %) | | | | |
| Example | 1 | (A-1) | 0.040 | (B-1) | 0.002 | (C-1) | 0.020 | (D-1) | 0.040 | (E-1) | 0.140 | 1.8 | 11.0 | 0.09 | 2 |
| | 2 | (A-1) | 0.038 | (B-1) | 0.005 | (C-1) | 0.013 | (D-1) | 0.060 | (E-1) | 0.197 | 2.1 | 11.6 | 0.04 | 17 |
| | 3 | (A-1) | 0.038 | (B-1) | 0.005 | (C-1) | 0.013 | (D-1) | 0.040 | (E-1) | 0.120 | 2.1 | 11.0 | 0.10 | 7 |
| | 4 | (A-1) | 0.030 | (B-1) | 0.005 | (C-1) | 0.013 | (D-1) | 0.040 | (E-1) | 0.197 | 1.7 | 11.8 | 0.04 | 12 |
| | 5 | (A-1) | 0.040 | (B-1) | 0.002 | (C-1) | 0.002 | (D-1) | 0.040 | (E-1) | 0.140 | 10.0 | 11.6 | 0.03 | 8 |
| | 6 | (A-1) | 0.038 | (B-2) | 0.005 | (C-1) | 0.013 | (D-1) | 0.060 | (E-1) | 0.197 | 2.1 | 11.5 | 0.03 | 5 |
| | 7 | (A-1) | 0.038 | (B-3) | 0.005 | (C-1) | 0.013 | (D-1) | 0.060 | (E-1) | 0.197 | 2.1 | 11.5 | 0.01 | 6 |
| | 8 | (A-1) | 0.038 | (B-1) | 0.005 | (C-2) | 0.013 | (D-1) | 0.060 | (E-1) | 0.197 | 2.1 | 11.5 | 0.04 | 8 |
| | 9 | (A-1) | 0.038 | (B-1) | 0.005 | (C-3) | 0.013 | (D-1) | 0.060 | (E-1) | 0.197 | 2.1 | 11.5 | 0.04 | 6 |
| | 10 | (A-1) | 0.040 | (B-1) | 0.011 | (C-1) | 0.011 | (D-1) | 0.040 | (E-1) | 0.140 | 1.8 | 11.4 | 0.07 | 5 |
| | 11 | (A-1) | 0.038 | (B-1) | 0.005 | (C-1) | 0.013 | (D-1) | 0.060 | (E-1) | 0.150 | 2.1 | 11.0 | 0.09 | 5 |
| Comparative Example | 1 | — | — | (B-1) | 0.002 | (C-1) | 0.020 | (D-1) | 0.040 | (E-1) | 0.140 | 0 | 11.5 | 0.03 | 33 |
| | 2 | (A-1) | 0.002 | (B-1) | 0.002 | (C-1) | 0.020 | (D-1) | 0.040 | (E-1) | 0.140 | 0.1 | 11.5 | 0.03 | 21 |
| | 3 | (A-1) | 0.440 | (B-1) | 0.002 | (C-1) | 0.020 | (D-1) | 0.040 | (E-1) | 0.140 | 20.0 | 8.6 | 0.25 | 4 |
| | 4 | (A-1) | 0.040 | (B-1) | 0.002 | (C-1) | 0.020 | — | — | (E-1) | 0.140 | 1.8 | 11.6 | 0.15 | 4 |
| | 5 | (A-1) | 0.040 | (B-1) | 0.002 | (C-1) | 0.020 | (D'-1) | 0.040 | (E-1) | 0.140 | 1.8 | 9.8 | 0.39 | 4 |
| | 6 | (A-1) | 0.038 | (B'-1) | 0.005 | (C-1) | 0.013 | (D-1) | 0.060 | (E-1) | 0.197 | 2.1 | 11.6 | 0.01 | 23 |
| | 7 | (A-1) | 0.030 | (B'-1) | 0.005 | (C-1) | 0.013 | (D-1) | 0.060 | (E-1) | 0.197 | 1.7 | 11.7 | 0.02 | 22 |

As seen from Table 1, the cleaning liquids obtained in Examples 1 to 11 have excellent removability of organic residue while preventing corrosion of copper.

On the other hand, because of not containing the component (A), the cleaning liquid obtained in Comparative Example 1 is poor in removability of organic residue.

Because of having a mass ratio of the component (A) to the total mass of the component (B) and the component (C)

lower than the lower limit, the cleaning liquid obtained in Comparative Example 2 is poor in removability of organic residue.

In addition, because of having a mass ratio of the component (A) to the total mass of the component (B) and the component (C) higher than the upper limit, the cleaning liquid obtained in Comparative Example 3 is poor in inhibitory effect of corrosion on copper.

Because of not containing the component (D), the cleaning liquid obtained in Comparative Example 4 is poor in inhibitory effect of corrosion on copper.

Further, because of containing a compound not containing the component (D), the cleaning liquid obtained in Comparative Example 5 is poor in inhibitory effect of corrosion on copper.

Because of containing a compound not containing the component (B), the cleaning liquids obtained in Comparative Examples 6 and 7 are poor in removability of organic residue.

Although the present invention is described in detail with reference to the specific embodiment, it will be apparent to those skilled in the art that various changes and modifications can be made without departing from the spirit and scope of the present invention. The present application is based on a Japanese Patent Application (Japanese Patent Application No. 2018-161077) filed on Aug. 30, 2018, contents of which are incorporated herein by reference.

INDUSTRIAL APPLICABILITY

Because of being excellent in removability of organic residue and inhibitory effect of corrosion on metals, the cleaning liquid according to the present invention can be suitably used for cleaning after chemical mechanical polishing and cleaning after etching, and can be particularly preferably used for cleaning after chemical mechanical polishing.

The invention claimed is:

1. A cleaning liquid comprising the following component (A) to component (D), wherein
a mass ratio of the component (A) to a total mass of the component (B) and the component (C) is 1 to 15:
component (A): a compound represented by the following formula (1);

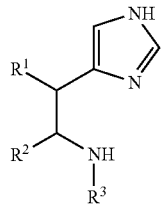

(1)

in the formula (1), $R^1$ represents a hydrogen atom or an alkyl group having 1 to 4 carbon atoms, $R^2$ represents a carboxyl group, a carbonyl group, a functional group having an ester bond, a hydrogen atom or an alkyl group having 1 to 4 carbon atoms, and $R^3$ represents an acetyl group, a hydrogen atom or an alkyl group having 1 to 4 carbon atoms;

component (B): an alkylamine;

component (C): a polycarboxylic acid; and component (D): an ascorbic acid.

2. The cleaning liquid according to claim 1, wherein a mass ratio of the component (C) to a mass of the component (B) is 1 to 15.

3. The cleaning liquid according to claim 1, wherein the component (A) contains at least one selected from the group consisting of histidine and derivatives of histidine.

4. The cleaning liquid according to claim 1, wherein the component (B) contains alkyldiamine.

5. The cleaning liquid according to claim 4, wherein alkyldiamine contains at least one selected from the group consisting of 1,2-diaminopropane, 1,3-diaminopropane, and N-methyl-1,3-diaminopropane.

6. The cleaning liquid according to claim 1, wherein the component (C) contains at least one selected from the group consisting of citric acid and derivatives of citric acid.

7. The cleaning liquid according to claim 1, further comprising the following component (E), component (E): a quaternary ammonium hydroxide.

8. The cleaning liquid according to claim 1, further comprising the following component (F), component (F): water.

9. The cleaning liquid according to claim 1, wherein a pH is 10.0 to 14.0.

10. The cleaning liquid according to claim 1, which is used for cleaning after chemical mechanical polishing or cleaning after etching.

11. The cleaning liquid according to claim 1, which is used for cleaning a surface where copper or a compound containing cobalt is exposed.

12. A cleaning method for cleaning a semiconductor wafer using the cleaning liquid according to claim 1.

13. A method for producing a semiconductor wafer, comprising: cleaning a semiconductor wafer using the cleaning liquid according to claim 1.

* * * * *